United States Patent
Seo et al.

(10) Patent No.: US 8,111,553 B2
(45) Date of Patent: Feb. 7, 2012

(54) NON-VOLATILE SEMICONDUCTOR MEMORY DEVICE IN WHICH PROGRAM DISTURB IS REDUCED AND METHOD OF PROGRAMMING THE SAME

(75) Inventors: Bo-Young Seo, Suwon-si (KR);
Hee-Seog Jeon, Suwon-si (KR);
Kwang-Tae Kim, Suwon-si (KR);
Ji-Hoon Park, Seongnam-si (KR);
Myung-Jo Chun, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 130 days.

(21) Appl. No.: 12/662,431

(22) Filed: Apr. 16, 2010

(65) Prior Publication Data

US 2010/0265765 A1 Oct. 21, 2010

(30) Foreign Application Priority Data

Apr. 20, 2009 (KR) .................. 10-2009-0034273

(51) Int. Cl.
*G11C 11/34* (2006.01)
*G11C 16/06* (2006.01)
(52) U.S. Cl. ................. 365/185.13; 365/185.2
(58) Field of Classification Search ............ 365/185.13, 365/185.2, 185.18
See application file for complete search history.

(56) References Cited

U.S. PATENT DOCUMENTS

| | | | |
|---|---|---|---|
| 7,339,828 B2 | 3/2008 | Hasegawa et al. | |
| 2004/0027865 A1* | 2/2004 | Mangan et al. | 365/189.07 |
| 2006/0023507 A1* | 2/2006 | Mangan et al. | 365/185.05 |
| 2008/0008003 A1 | 1/2008 | Yoo et al. | |
| 2008/0037326 A1 | 2/2008 | Kim et al. | |
| 2009/0073760 A1* | 3/2009 | Betser et al. | 365/185.2 |

FOREIGN PATENT DOCUMENTS

| | | |
|---|---|---|
| JP | 2006-114121 A | 4/2006 |
| KR | 10-0746292 B1 | 7/2007 |
| KR | 10-2008-0014258 A | 2/2008 |

* cited by examiner

*Primary Examiner* — Anh Phung
(74) *Attorney, Agent, or Firm* — Lee & Morse, P.C.

(57) ABSTRACT

A non-volatile semiconductor memory device capable of reducing program disturb and a method of programming the same are provided. A bit line connected to a non-selected memory cell in the same block as a selected memory cell enters a floating state by inactivating a bit line selection switch, so that voltage levels of an first conductivity type channel and a source/drain terminal formed in a pocket second conductivity type well below a memory transistor have an intermediate level of a voltage level of a selection line and the pocket P type well. Therefore, program disturb caused by FN tunneling and junction hot electrons can be inhibited.

10 Claims, 2 Drawing Sheets

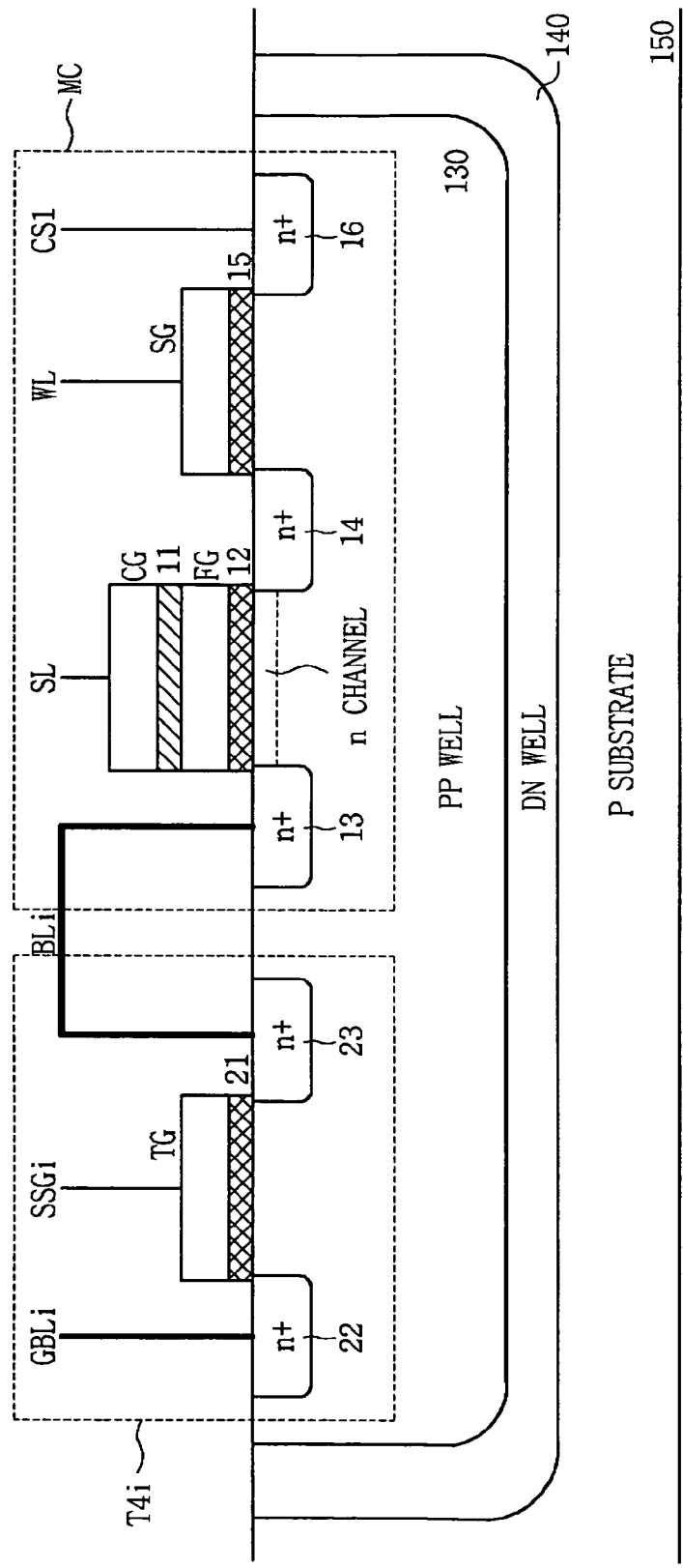

NON-VOLATILE SEMICONDUCTOR MEMORY DEVICE IN WHICH PROGRAM DISTURB IS REDUCED AND METHOD OF PROGRAMMING THE SAME

BACKGROUND

1. Field

Example embodiments relate to a non-volatile semiconductor memory device and a method of programming the same, and more particularly, to a non-volatile memory device in which program disturb is reduced and a method of programming the same.

2. Description of Related Art

A non-volatile memory device is a memory device in which data is retained even when power is removed. In contrast, in volatile memory devices, e.g., a dynamic random access memory (DRAM) or a synchronous random access memory (SRAM), data is lost when power is removed.

An electrically erasable programmable read-only memory (EEPROM) is a representative non-volatile memory device. The EEPROM is used to store permanent code, is typically programmed in unit of bytes, and is erased in units of blocks or sectors. Recently, a flash memory which is erased in units of bytes has been suggested, and as a representative example of a flash memory which is erasable in units of bytes, there is an EEPROM of a two transistor Fowler-Nordheim (2T FN) type.

The EEPROM of the 2T FN type refers to an EEPROM in which each memory cell is configured by two transistors, and a programming operation and an erase operation are performed by Fowler-Nordheim (FN) tunneling. The two transistors which configure the memory cell are serially connected. One of the two transistors is a memory transistor of a floating gate tunnel oxide (FLOTOX) type, and the other is a selection transistor.

A non-volatile semiconductor memory device using the EEPROM of the 2T FN type stores data by accumulating electrons on a floating gate by FN tunneling generated when a voltage of a certain condition is applied to a memory transistor selected at the time of a program operation. However, program disturb, in which a memory cell which is not selected at the time of the program operation is simultaneously programmed, may occur. The program disturb should be minimized for a reliable memory device.

SUMMARY

Embodiments are therefore directed to non-volatile semiconductor memory device and a method of programming the same, which substantially overcome one or more of the problems due to the limitations and disadvantages of the related art.

It is therefore a feature of an embodiment to provide a non-volatile semiconductor memory device in which program disturb is reduced.

It is therefore a feature of an embodiment to provide a method of programming a non-volatile semiconductor memory device in which program disturb is reduced.

At least one of the above and other features and advantages may be realized by providing a non-volatile semiconductor memory device, including at least one memory cell block including a plurality of memory cells, each memory cells including a memory transistor and a selection transistor serially connected between a plurality of bit lines and a common source line and have gates which are respectively connected to a plurality of selection lines and a plurality of word lines which are disposed in a direction perpendicular to the bit lines; a bit line selection switch block including a plurality of bit line selection switches which electrically connect the bit lines with corresponding global bit lines in response to voltages applied to a plurality of bit line selection switch lines, respectively; and a controller which decodes an address applied from the outside at the time of a program operation, controls the voltage applied to the bit line selection switch line, and electrically disconnects the bit line which is not selected from the global bit line to float the bit line which is not selected.

In example embodiments, the non-volatile semiconductor memory device may further include: a first conductive type substrate; a second conductive type deep well formed in a predetermined area within the substrate; and a first conductive type pocket well formed in a predetermined area within the deep well, wherein the memory cell block and the bit line selection switch block are formed in the pocket well.

In example embodiments, the controller may, at the time of the program operation, when the address is decoded to select the memory cell block, apply a first negative voltage to the word lines and a second negative voltage to the pocket well, and floats the common source line, and decode a row address of the address and apply a first positive voltage to the selection line which is selected and a ground voltage to the selection line which is not selected.

In example embodiments, when data applied from the outside is 1, a third negative voltage may be applied to the global bit line.

In example embodiments, the controller may, at the time of the program operation, decode a column address of the address and apply a second positive voltage to the bit line selection switch line which is selected and a fourth negative voltage to the bit line selection switch line which is not selected.

In example embodiments, the first positive voltage may have a voltage level which is larger in absolute value than the first to fourth negative voltages, the second positive voltage may have a voltage level which is smaller in absolute value than the first to third negative voltages, and the fourth negative voltage may have a voltage level which is smaller in absolute value than the second positive voltage.

Other example embodiments are directed to a method of programming a non-volatile semiconductor memory device which includes at least one memory cell block including a plurality of memory cells each of which includes a memory transistor and a selection transistor which are serially connected between a plurality of bit lines and a common source line and have gates which are respectively connected to a plurality of selection lines and a plurality of word lines which are disposed in a direction perpendicular to the bit lines, and a bit line selection switch block including a plurality of bit line selection switches which electrically connect the bit lines with corresponding global bit lines in response to voltages applied to a plurality of bit line selection switch lines, respectively, the method including: at the time of a program operation, decoding an address applied from the outside, controlling the voltage applied to the bit line selection switch line, and electrically disconnecting the bit line which is not selected from the global bit line to float the bit line which is not selected.

In some embodiments, the method of programming the non-volatile semiconductor memory device may further include, at the time of the program operation, when the address is decoded to select the memory cell block, applying a first negative voltage to the word lines; applying a second negative voltage to a pocket well in which the memory cell block and the bit line selection switch block are formed; and floating the common source line.

In some embodiments, the method of programming the non-volatile semiconductor memory device may further include, at the time of the program operation, decoding a row address of the address and applies a first positive voltage having a voltage level which is larger in absolute value than the first and second negative voltages to the selection line which is selected and a ground voltage to the selection line which is not selected; and when data applied from the outside is 1, applying a third negative voltage having a voltage level which is smaller in absolute value than the first positive voltage to the corresponding global bit line.

In some embodiments, floating the bit line may include decoding a column address of the address, applying a second positive voltage having a voltage level which is smaller in absolute value than the first to third negative voltages to the bit line selection switch line which is selected and a fourth negative voltage having a voltage level which is smaller in absolute value than the second positive voltage to the bit line selection switch line which is not selected.

BRIEF DESCRIPTION OF THE DRAWINGS

The above and other features and advantages will become more apparent to those of ordinary skill in the art by describing in detail exemplary embodiments with reference to the attached drawings, in which:

FIG. 2 illustrates a cross-sectional view of a memory cell of the non-volatile semiconductor memory device of FIG. 1.

DETAILED DESCRIPTION

Figure 1:
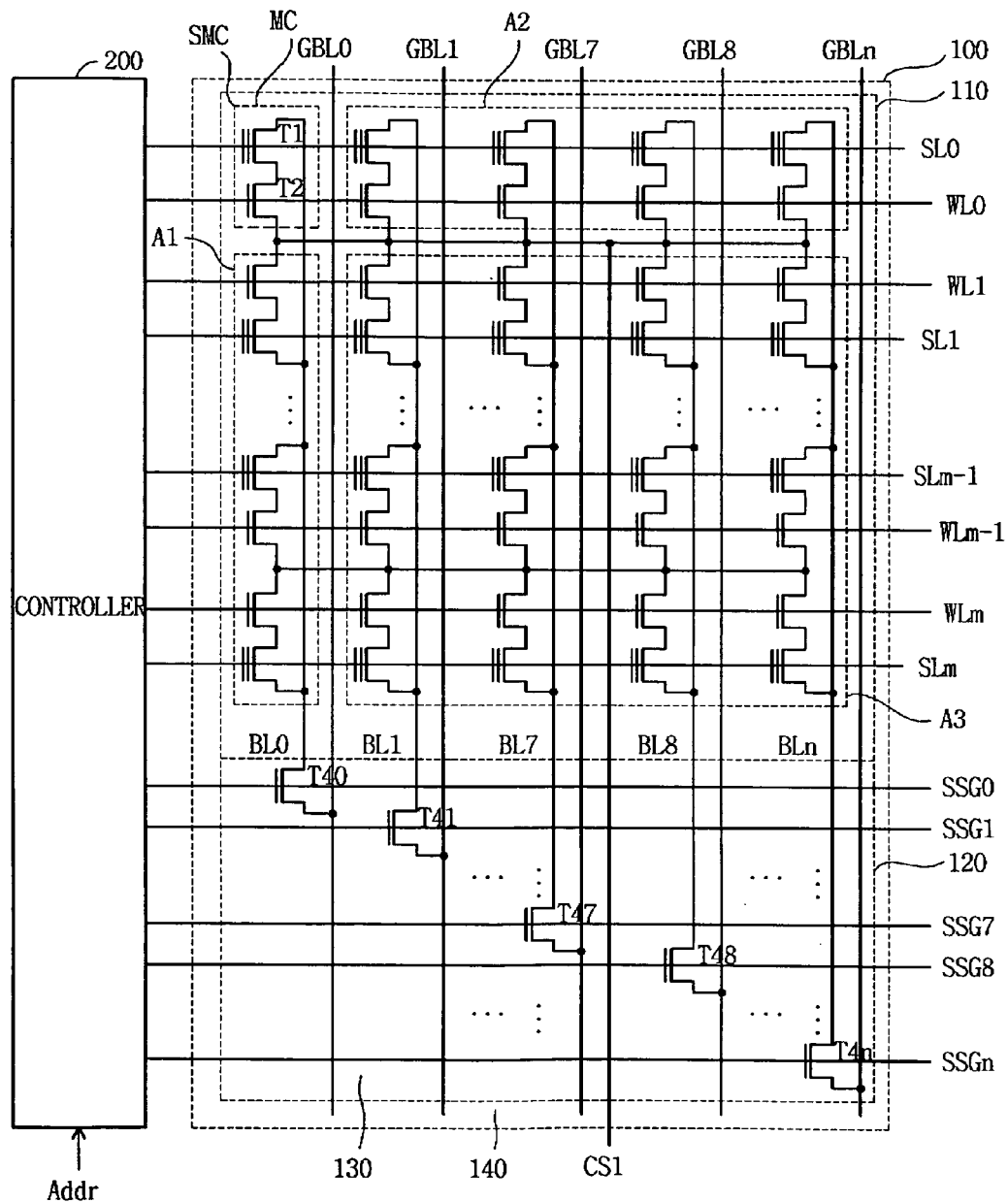
FIG. 1 illustrates a view of a memory cell array of a non-volatile semiconductor memory device according to an exemplary embodiment.

Korean Patent Application No. 10-2009-0034273, filed on Apr. 20, 2009, in the Korean Intellectual Property Office, and entitled: "Non-Volatile Semiconductor Memory Device in Which Program Disturb is Reduced and Method of Programming the Same," is incorporated by reference herein in its entirety.

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This inventive concept, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the inventive concept. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. Spatially relative terms, such as "beneath," "below," "lower," "above," "upper" and the like, may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the inventive concept is not limited to example embodiments described.

FIG. 1 illustrates a memory cell array of a non-volatile semiconductor memory device according to an exemplary embodiment. FIG. 2 illustrates a cross-sectional view of a memory cell of the non-volatile semiconductor memory device of FIG. 1. FIG. 2 illustrates one memory cell MC and one bit line selection switch T4*i* for convenience of illustration. Referring to FIGS. 1 and 2, a memory cell array 100 of a non-volatile semiconductor memory device may include at least one memory cell block 110 (which is also referred to as a sector) and a bit line selection switching block 120.

The memory cell block 110 may include a plurality of memory cells MC disposed in a matrix. Each memory cell MC may include two transistors, i.e., a memory transistor T1 and a selection transistor T2. The memory transistor T1 may serve to retain data and the selection transistor T2 may serve to select the memory transistor T1. The memory transistor T1 may be a FLOTOX type transistor having a floating gate (FG) and a control gate (CG). The selection transistor T2 may include a selection gate (SG).

The memory transistors T1 of the respective memory cells MC may be disposed between a plurality of selection lines SL0 to SLm disposed in a row direction and a plurality of bit lines BL0 to BLn disposed in a column direction, respectively. The selection transistors T2 may be disposed between a plurality of word lines WL0 to WLm disposed in a row direction and the plurality of bit lines BL0 to BLn, respectively. That is, the control gates CG of the memory transistors T1 in the memory cell block 110 may be commonly connected to the selection lines SL0 to SLm in units of rows, respectively. The selection gates SG of the selection transistors T2 may be commonly connected to the word lines WL0 to WLm in units of rows, respectively.

One end of the selection transistor T2 may be connected to the memory transistor T1 and the other end may be connected to a common source line CS1. Common source lines CS1 may be disposed for each row, each column, each sector, or an overall memory.

The bit line selection switching block 120 may include a plurality of bit line selection switches T40 to T4*n* which serve to selection memory cells in units of columns. Each of the bit line selection switches T40 to T4*n* may be implemented as a switching transistor of a predetermined number (for example, m (a natural number)) of memory cells which are disposed in a column direction. The bit line selection switches T40 to T4*n* selectively connect global bit lines GBL1 to GBLn disposed in a column direction with corresponding local bit lines BL0 to BLn, respectively, and may be controlled by bit line selection switch lines SSG0 to SSGn that extend in parallel to the word lines WL0 to WLm.

The bit line selection switches T40 to T4*n* may be positioned in an area of the same conductive type as the memory cell MC. For example, when the memory cell MC is positioned in a first conductive type area 130, the bit line selection switches T40 to T4*n* are also positioned in the first conductive type area 130. "First conductive type" and "second conductive type" are opposite in conductive type to each other, e.g., a P type and an N type. The conductive type area may be either a well or a semiconductor substrate. The bit line selection switches T40 to T4*n* may be, e.g., a PMOS type, an NMOS type, or a CMOS type. In an exemplary embodiment, the bit line selection switches T40 to T4*n* are implemented by N-type transistors.

A controller 200 may decode an address Addr applied from the outside, may select a corresponding block, and may apply a predetermined voltage, e.g., −5 V, to the well of the selected block during program operation. The controller 200 may also apply a predetermined voltage, e.g., −5 V, to the word lines of the'corresponding block. Further, the controller 200 may decode a row address and a column address of the address Addr, respectively, and may selectively activate or inactivate the selection lines SL0 to SLm and the bit line selection switch lines SSG0 to SSGn. In order to perform the operation, the controller 200 may include an X-decoder, a Y-decoder, and an instruction decoder (not shown).

As illustrated in FIG. 2, the memory cell MC of the non-volatile semiconductor memory device according to an exemplary embodiment may include the memory transistor T1 and the selection transistor T2 formed in a pocket P-type well 130 formed in a deep N-type well 140 formed in a P-type semiconductor substrate 150.

In the memory transistor T1, a floating gate FG is formed on a top surface of the pocket P-type well 130, an inter-gate insulator 11 is formed on the floating gate FG, and a control gate CG is formed on the inter-gate insulator 11. A gate insulator 12 is disposed between the pocket P-type well 120 and the floating gate FG. The gate insulator 12 may have a relatively thin tunneling area, i.e., the tunneling area may have a thickness which enables FN tunneling to be performed when the memory cell MC is programmed or erased. Electric charges move the floating gate FG through the tunneling area.

A selection gate SG may be disposed on the top surface of the pocket P-type well at a location adjacent to the floating gate FG as a gate of the selection transistor T2. A gate insulator 15 may be disposed between the pocket P-type well 130 and the selection gate SG. N-type source/drain terminals 13 and 16 may be formed in the pocket P-type well 130 at a left end of the floating gate FG and at a right end of the selection gate SG, respectively. The N-type common source/drain terminal 14 may be formed between the floating gate FG and the selection gate SG in the pocket P-type well 130.

In FIG. 2, the memory transistor T1 and the selection transistor T2 are different in structure. However, for simplification of a manufacturing process, the selection transistor T2 may further include an insulating pattern and a gate pattern analogous to the inter-gate insulator 11 and control gate CG of the memory transistor T1.

The control gate CG of the memory transistor T1 is connected to the selection line SL and the source/drain terminal 13 is connected to the bit line BL*i*. The selection gate SG of the selection transistor T2 is connected to the word line WL and the source/drain terminal 16 is connected to the common source line CS1.

A gate TG of the bit line selection switch T4*i* may be formed on the top surface of the pocket P-type well 130 at a location distant from the memory transistor T1 and the selection transistor T2. A gate insulator 21 may be disposed between the gate TG of the bit line selection switch T4*i* and the pocket P-type well 130 as in the selection transistor T2. N-type source and drain terminals 22 and 23 may be formed in the pocket P-type well 130 at both ends of the gate TG. The gate TG of the bit line selection switch T4*i* is connected to a bit line selection switch line SSG*i*, the source/drain terminal 22 is connected to a global bit line GBL*i*, and the source/drain terminal 23 and the source drain terminal 13 of the memory cell MC are commonly connected to the bit line BL*i*.

Table 1 below illustrates a voltage condition at the time of program operation of a non-volatile semiconductor memory device according to an exemplary embodiment.

TABLE 1

|  | PPW | SL | WL | GBL | SSG | BL | CS1 |
|---|---|---|---|---|---|---|---|
| Selected Cell | −5.0 V | 10.7 V | −5.0 V | −5.0/0 V | 1.5/−1 V | −5.0/FL | FL |
| A1 | −5.0 V | 0 V | −5.0 V | −5.0/0 V | 1.5/−1 V | −5.0/FL | FL |
| A2 | −5.0 V | 10.7 V | −5.0 V | 0 V | −1 V | FL(1 V) | FL |
| A3 | −5.0 V | 0 V | −5.0 V | 0 V | −1 V | FL(−2 V) | FL |

A program operation of a non-volatile semiconductor memory device according to an exemplary embodiment will be described with reference to Table 1 and FIGS. 1 and 2. First, part of the address Addr applied from the outside is decoded and a block of a memory cell array is selected. A first negative voltage, e.g., −5 V, is applied to the word lines WL0 to WLm of the selected block and a second negative voltage, e.g., −5 V, is applied to the pocket P-type well 130. A row address RA of the address Addr is decoded to select one of the selection lines SL0 to SLm and a first positive voltage, e.g., 10.7 V, is applied to the selected line SL. A ground voltage, e.g., 0 V, is applied to the selection lines which are not selected.

A column address CA of the address Addr applied from the outside is decoded to select one of the global bit line GBL0 to GBLn and a third negative voltage, e.g., −5 V, is applied to the selected global bit line GBL. That is, when data to be stored in the selected memory cell is 1, the third negative voltage is applied to the selected global bit line GBL. The ground voltage is applied to the global bit lines which are not selected.

In order to connect the selected global bit line with the corresponding bit line, a second positive voltage, e.g., 1.5 V, is applied to one of the bit line selection switch lines SSG1 to SSGn. Since the second positive voltage is applied to the gate connected to the selected bit line selection switch line, one of the bit line selection switches T40 to T4n is activated, and the selected global bit line and the corresponding bit line are electrically connected. Therefore, the selected bit line receives the third negative voltage through the selected global bit line.

At this time, the common source line CS1 is in a floating (FL) state. Since the first negative voltage is applied to both the word line from the selected memory cell SMC and the common source line CS1 in the floating state, a channel is not formed in the pocket P-type well 130 below the selection gate SG of the selection transistor T1, and the source/drain terminal 16 enters the floating state. Therefore, the common source line CS1 does not affect the source/drain terminal 14 between the floating gate FG and the selection gate SG.

When data to be stored in the selected memory cell is "1", since the third negative voltage is applied to the global bit line GBLi and the second positive voltage is applied to the selected bit line selection switch line SSGi, the third negative voltage is applied even to the corresponding bit line BLi. Therefore, the third negative voltage is applied to the source/drain terminal 13 of the memory transistor T1 connected to the bit line selection switch T4i through the bit line BLi. Further, since the first positive voltage is applied to the control gate CG through the selected selection line SL, an n channel is formed, as illustrated in FIG. 2. Since the third negative voltage is applied to the source/drain terminal 13 of the memory transistor T1 and the first positive voltage is applied to the control gate CG, FN tunneling is generated due to a voltage difference between the first positive voltage and the third negative voltage, so that electric charges supplied through the bit line BLi are accumulated on the floating gate FG. As a result, data 1 is stored in the memory cell MC.

An operation of a non-selected memory cell of the corresponding block while data is being stored in the selected memory cell MC will be described. The non-selected memory cells may be divided into three areas. In a first area A1, a memory cell is disposed in the same column as the selected memory cell SMC and shares the bit line BLi and the global bit line GBLi with the selected memory cell SMC. In a second area A2, a memory cell is disposed in the same row as the selected memory cell SMC and shares the selection line SL and the word line WL with the selected memory cell SMC. In a third area A3, a memory cell is disposed in a different row and a different column from the selected memory cell SMC.

Since the memory cells in the same block 100 are formed in the same pocket P-type well 130, the pocket P-type well 130 receives the second negative voltage equally in all areas. In all areas, the word line WL receives the first negative voltage and the common source line CS1 enters the floating state.

Since the memory cell of the first area A1 shares the global bit line GBLi, the bit line BLi, and the bit line selection switch line SSGi with the selected memory cell SMC, the third negative voltage or the ground voltage is applied to the global bit line GGLi and the bit line BLi of the first area A1, and the second positive voltage is applied to the bit line selection switch lines SSGi. However, the ground voltage is applied to the selection line SL of the memory cell of the first area A1. That is, the memory cell of the first area A1 receives the same voltage as the selected memory cell SMC, except for the voltage applied through the selection line SL. Since the voltage applied through the selection line SL is the ground voltage, FN tunnel is hardly generated. Thus, data 1 is not stored in the non-selected cells.

Since the memory cell of the second area A2 shares the selection line SL with the selected memory cell SMC, the first positive voltage is applied to the selection line SL and the ground voltage is applied to the global bit line GBL. However, a fourth negative voltage, e.g., −1 V, is applied to the corresponding bit line selection switch line SSG. Since the fourth negative voltage is applied to the bit line selection switch line SSG, the bit line selection switch T3 is inactivated, and the bit line BL enters the floating state. When the bit line BL enters the floating state while the first positive voltage is applied to the selection line SL and the second negative voltage is applied to the pocket P-type well 130, a voltage level of the n channel formed in the pocket P-type well 130 below the floating gate FG has a voltage level of the third positive voltage, e.g., 1 V, due to influence of the first positive voltage and the second negative voltage. When the n channel has the voltage level of the third positive voltage, since a voltage difference between the voltage level of the n channel and the first positive voltage applied to the selection line SL is not large, accumulation of electric charges due to FN tunneling does not occur.

In the memory cell of the third area A3, the ground voltage is applied to the selection line SL and the global bit line GBL.

The fourth negative voltage, e.g., −1 V, is applied to the corresponding bit line selection switch line SSG like the memory cell of the second area A2. Since the fourth negative voltage is applied to the bit line selection switch line SSG, the bit line selection switch T4$i$ is inactivated, and the bit line BL enters the floating state. When the bit line BL enters the floating state while the ground voltage is applied to the selection line SL and the second negative voltage is applied to the pocket P-type well 130, the source/drain terminal 14 between the floating gate FG and the selection gate SG has a voltage level of a fifth negative voltage, e.g., −2 V, due to influence of the ground voltage applied to the selection line SL and the second negative voltage applied to the pocket P-type well 130.

When the source/drain terminal 14 between the floating gate FG and the selection gate SG has a voltage level of the fifth negative voltage, e.g., −2 V, since a voltage difference between the fifth negative voltage of the source/drain terminal 14 and the second negative voltage of the pocket P-type well 130 is not large, accumulation of electric charges on the floating gate FG due to band-to-band tunneling (BTBT) occurring due to junction hot electrons does not occur.

When data to be stored in the memory cell is 0, a voltage of the same condition as when the memory cell is not selected is applied to all memory cells. That is, all memory cells in the block correspond to the third area A3.

In the existing non-volatile semiconductor memory device, the second positive voltage which is the same as the voltage of the bit line selection switch lines SSGi for the selected memory cell SMC is applied to the bit line selection switch line SSG for the second and third areas A2 and A3. When the bit line selection switch line SSGi receives the second positive voltage and is activated, the ground voltage is applied to the bit line BL through the global bit line GBL. Therefore, in the memory cell of the second area A2, the voltage level of the n channel formed in the pocket P-type well 130 below the floating gate FG has the ground voltage level. Therefore, there is a phenomenon in which the memory cell of the second area A2 which does not have to be programmed is soft-programmed due to FN tunneling generated by the voltage difference between the first positive voltage applied through the selection line SL and the voltage level of the n channel. This phenomenon is referred to as program disturb. In the memory cell of the third area A3, the ground voltage applied through the bit line BL enables the source/drain terminal 14 between the floating gate FG and the selection gate SG to have the ground voltage level, and junction hot electrons are generated between the source/drain terminal 14 and the pocket P-type well 130 due to the voltage difference between the source/drain terminal 14 and the pocket P-type well 130. The generated junction hot electrons are accumulated on the floating gate FG due to band-to-band tunneling, so that the memory cell of the third area A3 which does not have to be programmed is soft-programmed. That is, the program disturb occurs.

In order to prevent the program disturb, a voltage level applied to the bit line for the memory cell of the second area A2 has to be increased, and a voltage level applied to the bit line for the memory cell of the third area A3 has to be decreased. However, since the memory cells of the second and third areas A2 and A3 share the same bit line, it is difficult to adjust the bit lines for the memory cells of the second and third areas A2 and A3 to have different voltage levels.

However, in the non-volatile semiconductor memory device according to an exemplary embodiment, the fourth negative voltage is applied to the bit line selection switch line SSG for the non-selected memory cell to inactivate the bit line selections switch T4$i$. The inactivated bit line selection switch T4$i$ electrically disconnects a connection between the global bit line GBL and the bit line BL, whereby the bit line enters the floating state. As the bit line BL enters the floating state, the n channel formed below the floating gate FG and the source/drain terminal 14 between the floating gate FG and the selection gate SG have the voltage level between the selection line SL and the pocket P-type well 130. Therefore, the voltage difference between the voltage level of the n channel or the source/drain terminal 14 and the voltage level of the selection line SL or the pocket P-type well 130 is reduced, thereby preventing the program disturb.

As described above, a non-volatile semiconductor memory device according to an exemplary embodiment enables a bit line, which is connected to a non-selected memory cell disposed in the same block as a selected memory cell, to enter a floating state, thereby preventing program disturb occurring due to FN tunneling or junction hot electrons at the same time.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A non-volatile semiconductor memory device, comprising:
   at least one memory cell block including a plurality of memory cells, each memory cell including a memory transistor and a selection transistor serially connected between a plurality of bit lines and a common source line, the memory transistor and the selection transistor having gates respectively connected to a plurality of selection lines and a plurality of word lines disposed in a direction perpendicular to the bit lines;
   a bit line selection switch block including a plurality of bit line selection switches configured to electrically connect the bit lines with corresponding global bit lines in response to voltages applied to a plurality of bit line selection switch lines, respectively; and
   a controller configured to decode an address applied externally at the time of a program operation, control the voltage applied to the bit line selection switch line, and electrically disconnect a bit line that is not selected from the global bit line to float the bit line that is not selected.

2. The non-volatile semiconductor memory device as claimed in claim 1, further comprising:
   a first conductive type substrate;
   a second conductive type deep well formed in a predetermined area within the substrate; and
   a first conductive type pocket well formed in a predetermined area within the deep well,
   wherein the memory cell block and the bit line selection switch block are formed in the pocket well.

3. The non-volatile semiconductor memory device as claimed in claim 2, wherein, at the time of the program operation, when the decoded address selects the memory cell block, the controller is configured to:
- apply a first negative voltage to the word lines and a second negative voltage to the pocket well;
- float the common source line;
- decode a row address of the address; and
- apply a first positive voltage to the selection line which is selected and a ground voltage to the selection line which is not selected.

4. The non-volatile semiconductor memory device as claimed in claim 3, wherein when data applied from the outside is 1, a third negative voltage is applied to the global bit line.

5. The non-volatile semiconductor memory device as claimed in claim 4, wherein, at the time of the program operation, the controller is configured to:
- decode a column address of the address;
- apply a second positive voltage to a bit line selection switch line that is selected; and
- apply a fourth negative voltage to a bit line selection switch line that is not selected.

6. The non-volatile semiconductor memory device as claimed in claim 5, wherein the first positive voltage has a voltage level with a larger absolute value than the first to fourth negative voltages, the second positive voltage has a voltage level with a smaller absolute value than the first to third negative voltages, and the fourth negative voltage has a voltage level with a smaller absolute value than the second positive voltage.

7. A method of programming a non-volatile semiconductor memory device which includes at least one memory cell block including a plurality of memory cells, each memory cell including a memory transistor and a selection transistor serially connected between a plurality of bit lines and a common source line, the memory transistor and the selection transistor having gates respectively connected to a plurality of selection lines and a plurality of word lines disposed in a direction perpendicular to the bit lines, and a bit line selection switch block, including a plurality of bit line selection switches configured to electrically connect the bit lines with corresponding global bit lines in response to voltages applied to a plurality of bit line selection switch lines, respectively, the method comprising, at the time of a program operation:
- decoding an address applied externally;
- controlling the voltage applied to the bit line selection switch line; and
- electrically disconnecting a bit line that is not selected from the global bit line to float the bit line that is not selected.

8. The method as claimed in claim 7, further comprising, at the time of the program operation, when the decoded address selects the memory cell block:
- applying a first negative voltage to the word lines;
- applying a second negative voltage to a pocket well in which the memory cell block and the bit line selection switch block are formed; and
- floating the common source line.

9. The method as claimed in claim 8, further comprising, at the time of the program operation:
- decoding a row address of the address;
- applying a first positive voltage having a voltage level having a larger absolute value than the first and second negative voltages to the selection line which is selected and a ground voltage to the selection line which is not selected; and
- when data applied from the outside is 1, applying a third negative voltage having a voltage level having a smaller absolute value than the first positive voltage to the corresponding global bit line.

10. The method as claimed in claim 9, wherein floating the bit line comprises
- decoding a column address of the address; and
- applying a second positive voltage, having a voltage level having a smaller absolute value than the first to third negative voltages, to a bit line selection switch line that is selected and a fourth negative voltage, having a voltage level which is smaller in absolute value than the second positive voltage, to a bit line selection switch line that is not selected.

* * * * *